United States Patent
Chen et al.

(10) Patent No.: US 10,171,038 B1
(45) Date of Patent: Jan. 1, 2019

(54) ENVELOPE-TRACKING POWER SUPPLY MODULATOR

(71) Applicant: REALTEK SEMICONDUCTOR CORPORATION, Hsinchu (TW)

(72) Inventors: Ke-Horng Chen, Hsinchu (TW); Shang-Hsien Yang, Yunlin County (TW); Tsung-Yen Tsai, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/840,634

(22) Filed: Dec. 13, 2017

(30) Foreign Application Priority Data

Jun. 19, 2017 (TW) .............................. 106120425 A

(51) Int. Cl.
  *H03F 3/217* (2006.01)
  *H03F 1/02* (2006.01)
  *H03F 3/19* (2006.01)
  *H03F 3/21* (2006.01)

(52) U.S. Cl.
  CPC ............. *H03F 1/0227* (2013.01); *H03F 3/19* (2013.01); *H03F 3/21* (2013.01); *H03F 2200/102* (2013.01); *H03F 2200/451* (2013.01); *H03F 2200/507* (2013.01)

(58) Field of Classification Search
  CPC ....................................................... H03F 3/217
  USPC ......................................................... 330/251
  See application file for complete search history.

(56) References Cited

U.S. PATENT DOCUMENTS

| | | | | |
|---|---|---|---|---|
| 7,076,070 | B2* | 7/2006 | Pearce ................ | H01L 21/8234 257/368 |
| 9,225,253 | B2* | 12/2015 | Lei .......................... | H02M 3/158 |
| 2004/0169552 | A1* | 9/2004 | Butler ..................... | H03F 3/217 330/10 |
| 2008/0310046 | A1* | 12/2008 | Menegoli ............... | G11B 21/02 360/75 |

(Continued)

OTHER PUBLICATIONS

Hassan et al., "A CMOS Dual-Switching Power-Supply Modulator with 8% Efficiency Improvement for 20MHz LTE Envelope Tracking RF Power Amplifiers," 2013 IEEE International Solid-State Circuits Conference/ Session 21/ Power Converters/ 21.3.

(Continued)

*Primary Examiner* — Henry Choe
(74) *Attorney, Agent, or Firm* — WPAT, PC

(57) ABSTRACT

An envelope-tracking power supply modulator (ETSM) supplies power to a radio frequency power amplifier (RFPA) of a radio frequency (RF) circuit according to a baseband envelope signal. The ETSM includes a linear amplifier, a capacitor, a single inductor multiple output (SIMO) switch-mode converter, and a controller. The linear amplifier receives the baseband envelope signal, and has its output terminal coupled to a power input of the RFPA. One terminal of the capacitor is coupled to a reference voltage, and the other terminal is coupled to a power input of the linear amplifier. The SIMO switch-mode converter includes two output terminals. One of the output terminals is coupled to the capacitor and the power input of the linear amplifier, and the other of the output terminals is coupled to the output terminal of the linear amplifier and the power input of the RFPA. The controller controls the SUMO switch-mode converter.

12 Claims, 6 Drawing Sheets

(56) References Cited

U.S. PATENT DOCUMENTS

2014/0062495 A1* 3/2014 Carter .............. H01J 37/32944
324/459

OTHER PUBLICATIONS

Lee et al., "A Hybrid Supply Modulator with 10dB ET Operation Dynamic Range Acchieving a PAE of 42.6% at 27.0dBm PA Output Power," 2015 IEEE International Solid-State Circuits Conference/ Session 2 / RF TX/RX Design Techniques / 2.7.
Riehl et al., "An AC-Coupled Hybrid Envelope Modulator for HSUPA Transmitters with 80% Modulator Efficiency," 2013 IEEE International Solid-State Circuits Conference/ Session 21 / Power Converters/ 21.2.
Paek et al., "An RF-PA Supply Modulator Achieving 83% Efficiency and -136dBm/Hz Noise for LTE-40MHz and GSM 35dBM Applications," 2016 IEEE International Solid-State Circuits Conference/ Session 20 / RF-toTHz Transceiver Techniques/ 20.7.
Arno et al., "Envelope Modulator for Multimode Transmitters with AC-Coupled Multilevel Regulators," 2014 IEEE International Solid-State Circuits Conference / Session 17 / Analog Techniques / 17.6.
Yang et al., "A Single-Inductor Dual-Output Converter with Linear-Amplifier-Driven Cross Regulation for Prioritized Energy-Distribution Control of Envelope-Tracking Supply Modulator," 2017 IEEE International Solid-State Circuits Conference / Session 2 / Power Amplifiers / 2.3.
Yang et al., "A single-inductor dual-output converter with linear-amplifier-driven cross regulation for prioritized energy-distribution control of envelope-tracking supply modulator," abstract, IEEE.org, IEEE Xplore Digital Library, IEEE-SA, IEEE Spectrum.

* cited by examiner

ENVELOPE-TRACKING POWER SUPPLY MODULATOR

BACKGROUND

1. Field of the Disclosure

The present disclosure generally relates to dynamic power supply technology, and, more particularly, to envelope-tracking power supply modulators.

2. Description of Related Art

In order to use the wireless communication band in an efficient way, modern modulation technology tends to modulate the amplitude of the envelope, resulting in a sharp increase in the peak-to-average ratio (PAPR) of the envelope. Consequently, a power management circuit that originally supplies a constant voltage must be adapted to accordingly adjust its output voltage in a dynamic manner to avoid unnecessary power consumption, which results from a considerable difference between an output voltage of a radio frequency power amplifier (RFPA) employed in a transmitting end of a wireless communication system and an output voltage of the power management circuit. This type of power management circuit is referred to as a composite envelope-tracking power supply modulator (ETSM).

Primarily used in a portable electronic device, such as a smartphone, the composite ETSM and the RFPA are powered by the power source (such as a lithium battery) of the portable electronic device. However, because the working voltage suitable for a linear amplifier within the composite ETSM may be very different from the voltage provided by the portable electronic device, a stand-alone switch-mode converter is typically provided to exclusively power the linear amplifier. FIG. 1 is a circuit diagram of a conventional composite ETSM with hysteresis control combined with a switched-mode converter. The composite ETSM 110 with hysteresis control provides average energy for the RFPA 120, and the switch-mode converter 130 provides a stable voltage for the linear amplifier 112 of the composite ETSM 110 with hysteresis control. The working principles of the composite ETSM 110 with hysteresis control and the switch-mode converter 130 are well known to those of ordinary skill in the art and thus omitted for brevity.

One of the drawbacks of the circuit in FIG. 1 is the usage of two inductors (L1 and L2), which causes an increase in the overall cost and area of the circuit.

SUMMARY OF THE DISCLOSURE

In view of the issues of the prior art, an object of the present disclosure is to provide an envelope-tracking power supply modulator (ETSM) to lower hardware costs, reduce circuit area, and improve circuit performance.

An ETSM is provided. The ETSM supplies power to a radio frequency power amplifier (RFPA) of a radio frequency (RF) circuit according to a baseband envelope signal. The ETSM includes a linear amplifier, a capacitor, a single-inductor multiple-output (SIMO), and a controller. The linear amplifier has an input terminal and an output terminal. The input terminal receives the baseband envelope signal, and the output terminal is coupled to a power input of the RFPA. The capacitor has a first terminal and a second terminal. The first terminal of the capacitor is coupled to a reference voltage, and the second terminal of the capacitor is coupled to a power input of the linear amplifier. The SIMO switch-mode converter has a first output terminal and a second output terminal. The first output terminal of the SIMO switch-mode converter is coupled to the capacitor and the power input of the linear amplifier, and the second output terminal of the SIMO switch-mode converter is coupled to the output terminal of the linear amplifier and the power input of the RFPA. The controller, which is coupled to the linear amplifier, the capacitor, and the SIMO switch-mode converter, controls the SIMO switch-mode converter.

Another ETSM is also provided. The ETSM supplies power to an RFPA of an RF circuit according to a baseband envelope signal. The ETSM includes a linear amplifier, an inductor, a capacitor, a first switch, a second switch, a third switch, a fourth switch, a current detector, and a controller. The linear amplifier has an input terminal and an output terminal. The input terminal of the amplifier receives the baseband envelope signal, and the output terminal of the amplifier is coupled to a power input of the RFPA. The capacitor has a first terminal and a second terminal. The first terminal of the capacitor is coupled to a reference voltage, and the second terminal of the capacitor is coupled to a power input of the linear amplifier. The first switch is coupled to the inductor. The second switch is coupled to the inductor and the first switch. The third switch is coupled between the inductor and the second terminal of the capacitor. The fourth switch is coupled between the inductor and the output terminal of the linear amplifier. The current detector, which is coupled to the inductor, detects the current flowing through the inductor. The controller is coupled to the linear amplifier, the capacitor, the first switch, the second switch, the third switch, the fourth switch, and the current detector. The controller controls the current flowing through the inductor by controlling the duty cycles of the first switch and the second switch.

The ETSM of this disclosure requires only one inductor to achieve power supply control of linear amplifiers and radio frequency power amplifiers (RFPAs), thereby reducing hardware costs. In addition, compared to the prior art, by exploiting the cross-regulation characteristic of a single inductor multiple output (SIMO) switch-mode converter, this disclosure can track the baseband envelope signals in a more effective manner and thus avoid energy waste.

These and other objectives of the present disclosure no doubt become obvious to those of ordinary skill in the art after reading the following detailed description of the preferred embodiments with reference to the various figures and drawings.

BRIEF DESCRIPTION OF THE DRAWINGS

FIG. 5 illustrates a circuit diagram of FIG. 2 when the transistor $M_{REG}$ is turned off and the transistor $M_{AVG}$ is turned on.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 2:
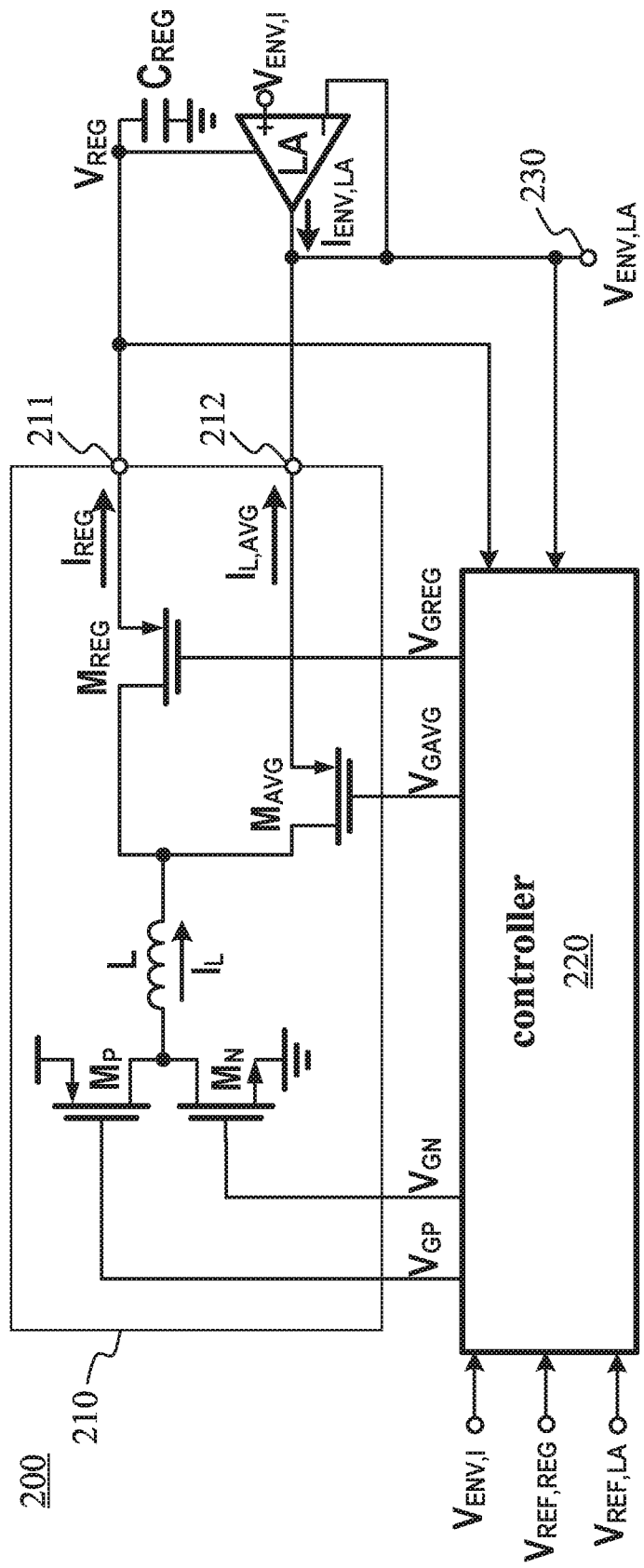
FIG. 2 illustrates a circuit diagram of an ETSM according to an embodiment of this disclosure.

FIG. 2 is a circuit diagram of an envelope-tracking power supply modulator (ETSM) according to an embodiment of this disclosure. The ETSM 200 includes a single inductor multiple output (SIMO) switch-mode converter 210, a controller 220, a capacitor $C_{REG}$, and a linear amplifier LA. The term "SIMO" means two or more than two outputs are included, and a single inductor dual output (SIDO) switch-mode converter can be seen as an embodiment of a SIMO switch-mode converter with only two outputs. Because two of the "multiple outputs" (i.e., an output terminal 211 and an output terminal 212 in FIG. 2) are used to realize this disclosure, a SIDO switch-mode converter can also be used for the implementation of this disclosure. The capacitor $C_{REG}$ has one of its two terminals coupled to a reference voltage (e.g., ground) and the other coupled to one of the output terminals of the SIMO switch-mode converter 210 (i.e., the output terminal 211 in this illustrative example). One of the inputs of the linear amplifier LA receives the baseband envelope signal $V_{ENV,I}$, and the output terminal of the linear amplifier LA is coupled to the other output terminal of the SIMO switch-mode converter 210 (i.e., the output terminal 212 in this illustrative example) and the output terminal 230 of the ETSM 200. The power input of the linear amplifier LA is coupled to the output terminal 211 and the capacitor $C_{REG}$. The output terminal 230 is coupled to a power input of an RFPA (not shown) to provide the RFPA with a voltage $V_{ENV,LA}$.

The SIMO switch-mode converter 210 includes an inductor L and four switches which are respectively implemented by transistors $M_P$, $M_N$, $M_{REG}$ and $M_{AVG}$. In some embodiments, the transistors $M_P$ and $M_N$ are coupled between the power supply voltage and ground. By adjusting the turn-on time of the transistors $M_P$ and $M_N$, the magnitude of the current $I_L$ of the inductor L is controlled. By adjusting the turn-on time of the transistors $M_{REG}$ and $M_{AVG}$, the current $I_L$ is controlled to be outputted through the output terminal 211 or the output terminal 212. More specifically, in one switching cycle of the transistors $M_{REG}$ and $M_{AVG}$, if the turn-on time of the transistor $M_{REG}$ is greater than the turn-on time of the transistor $M_{AVG}$, it indicates that more energy is outputted in this switching cycle through the output terminal 211 than through the output terminal 212; however, if the turn-on time of the transistor $M_{REG}$ is less than the turn-on time of the transistor $M_{AVG}$, it indicates that more energy is outputted in this switching cycle through the output terminal 212 than through the output terminal 211. The ON/OFF states of the four switches are respectively controlled by the four control signals $V_{GP}$, $V_{GN}$, $V_{GAVG}$, and $V_{GREG}$ outputted by the controller 220. The controller 220 generates the four control signals according to the voltage $V_{REG}$ at the output terminal 211, the voltage $V_{ENV,LA}$ at the output terminal 212, the baseband envelope signal $V_{ENV,I}$, the reference voltage $V_{REF,REG}$, the reference voltage $V_{REF,LA}$, and the inductor current $I_L$. The inner circuit of the controller 220 is described in detail later.

One of the main functions of the ETSM 200 is to ensure that the voltage $V_{ENV,LA}$ at the output terminal 230 can smoothly track the baseband envelope signal $V_{ENV,I}$. In a normal situation where the peak value of the baseband envelope signal $V_{ENV,I}$ is relatively stable, the energy outputted through the output terminal 230 is primarily provided by the linear amplifier LA; in this instance, the inductor current $I_L$ of the SIMO switch-mode converter 210 is provided through the output terminal 211 to serve as the working voltage of the linear amplifier LA. In other situations where the peak value of the baseband envelope signal $V_{ENV,I}$ has an abrupt increase, the linear amplifier LA raises its output current $I_{ENV,LA}$ to increase the voltage $V_{ENV,LA}$ at the output terminal 230. To raise the output current $I_{ENV,LA}$, the linear amplifier LA draws more energy from the capacitor $C_{REG}$, thereby causing the voltage $V_{REG}$ to drop. Upon detecting a voltage drop of the voltage $V_{REG}$, the controller 220 increases the current $I_L$ of the inductor L by increasing the duty cycle of the transistor $M_P$ and decreasing the duty cycle of the transistor $M_N$. The increased inductor current $I_L$ in turn causes the current $I_{L,AVG}$ and the current $I_{REG}$ to increase. The increased current $I_{L,AVG}$ provides more energy at the output terminal 230 to increase the voltage $V_{ENV,LA}$ at the output terminal 230, while the increased current $I_{REG}$ provides the linear amplifier LA with the more energy needed due to the increase of the baseband envelope signal $V_{ENV,I}$.

As described above, this disclosure takes advantage of the cross-regulation characteristic of the SIMO switch-mode converter 210 to improve the response speed at which the voltage $V_{ENV,LA}$ at the output terminal 230 tracks the baseband envelope signal $V_{ENV,I}$. More specifically, the cross-regulation characteristic has the following mechanism: when the load at one of the output terminals of the SIMO switch-mode converter 210 increases, the inductor current $I_L$ becomes larger to supply more energy at that output terminal; however, the increased inductor current $I_L$ inevitably causes the SIMO switch-mode converter 210 to provide more energy at other output terminals as well, resulting in excess energy outputted to the loads at other output terminals. By exploiting this mechanism, this disclosure enables the output voltage $V_{ENV,LA}$ of the ETSM 200 to more smoothly track the baseband envelope signal $V_{ENV,I}$. Since this mechanism does not need to rely on a linear circuit to reflect the change in the inductor current $I_L$ within a finite bandwidth, the cross-regulation effect can be reflected on the output voltage $V_{ENV,LA}$ within one switching cycle. As the inductor current $I_L$ increases, the increased current $I_{REG}$ causes the capacitor $C_{REG}$ to stabilize the voltage $V_{REG}$ at the desired value, thus ending the cross-regulation effect.

Figure 1:
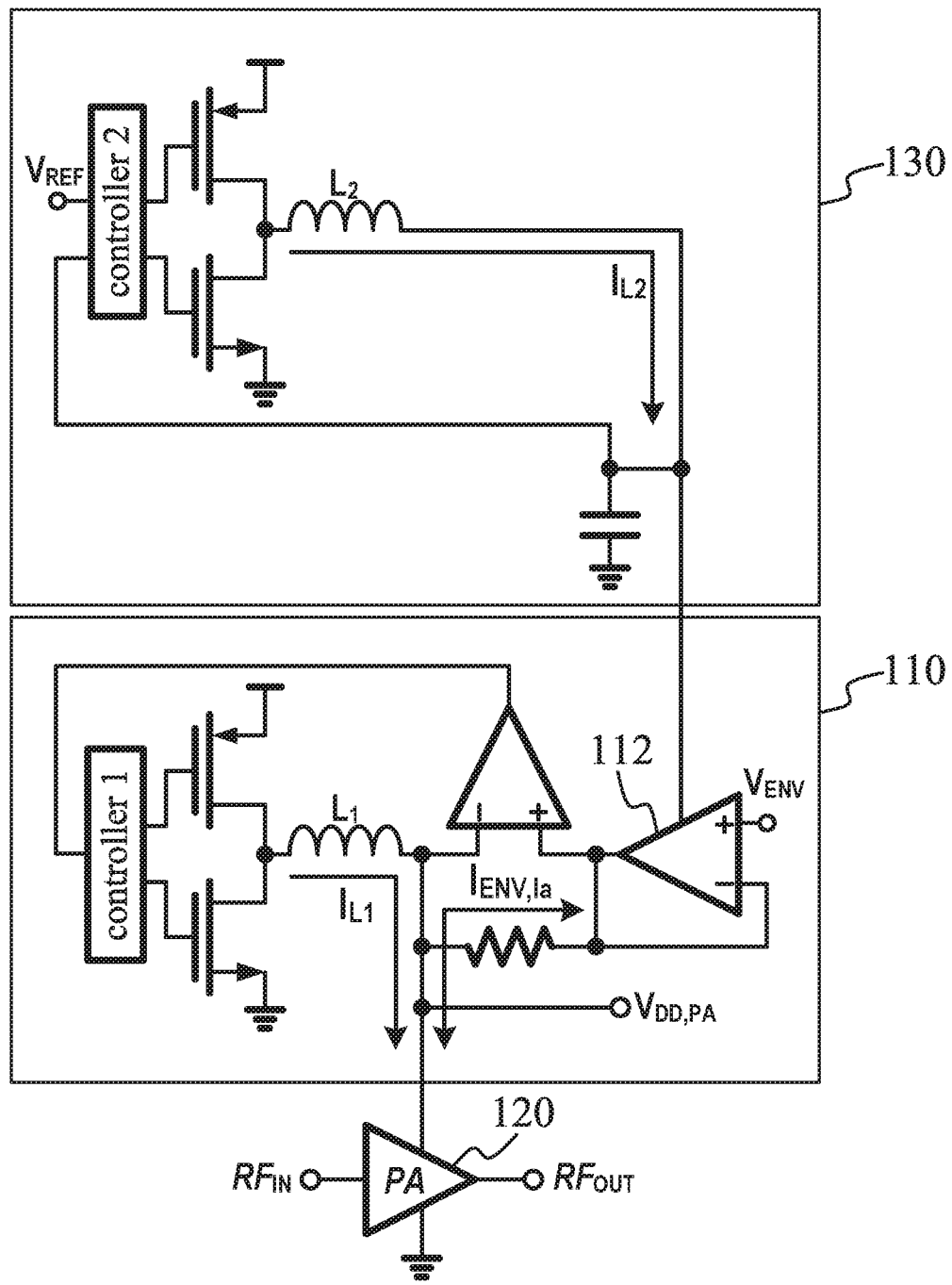
FIG. 1 illustrates a circuit diagram of a conventional composite envelope-tracking power supply modulator (ETSM) with hysteresis control combined with a switched-mode converter.

In addition to the advantages described above, the ETSM 200 does not cause excess current to flow into the linear amplifier LA, which, in comparison with prior art, avoids energy waste or excess power consumption. More specifically, as shown in FIG. 1, when the RFPA 120 does not demand great energy, excess current $I_{LI}$ flows into the linear amplifier 112, thereby causing a waste of energy. In some cases, the phase shift between the linear amplifier 112 and the switch-mode converter 130 may also result in energy waste. In this disclosure, however, when the RFPA requires a working current lower than the inductor current $I_L$, the energy outputted by the ETSM 200 is primarily supplied by the linear amplifier LA, while the energy of the SIMO switch-mode converter 210 is mainly outputted via the current $I_{REG}$. As a result, the current $I_{L,AVG}$ keeps relatively low to avoid energy waste due to unwanted excess energy supplied to the linear amplifier LA.

Figure 3:
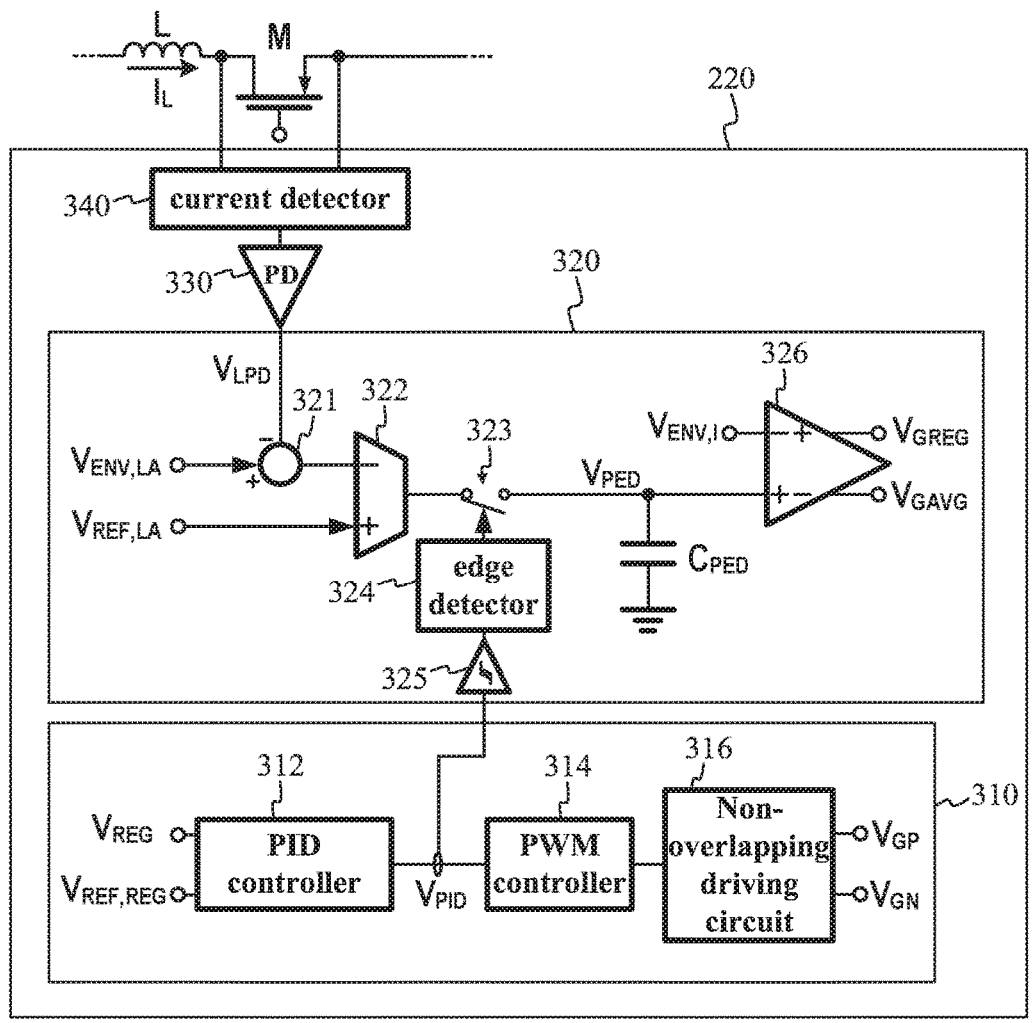
FIG. 3 illustrates a detailed circuit diagram of the controller 220 of FIG. 2.

FIG. 3 is a detailed circuit diagram of the controller 220 of FIG. 2. The controller 220 includes an inductor current control circuit 310, a current proportion control circuit 320, a peak detector 330, and a current detector 340. When the linear amplifier LA works under a relatively stable voltage $V_{REG}$, the inductor current control circuit 310 controls the duty cycles of the control signal $V_{GP}$ and $V_{GN}$ based mainly on the voltage $V_{REG}$. That is, the inductor current control circuit 310 generates the control signals $V_{GP}$ and $V_{GN}$ according to the voltage $V_{REG}$ and the reference voltage $V_{REF,REG}$. More specifically, the purpose of the proportional-integral-derivative (PID) controller 312 is to lock the voltage $V_{REG}$ so that the voltage $V_{REG}$ is substantially equal to the reference voltage $V_{REF,REG}$. The error signal $V_{PID}$ generated by the PID controller 312 indicates the degree of difference between the voltage $V_{REG}$ and the reference voltage $V_{REF,REG}$, and the pulse width modulation (PWM) controller 314 adjusts the duty cycles of the control signals $V_{GP}$ and $V_{GN}$ according to the error signal $V_{PID}$. The non-overlapping driving circuit 316 ensures that the transistors $M_P$ and $M_N$ are not turned on at the same time. When the voltage $V_{REG}$ is smaller than the reference voltage $V_{REF,REG}$, the inductor current control circuit 310 increases the duty cycle of the control signal $V_{GP}$ and decreases the duty cycle of the control signal $V_{GN}$ to increase the inductor current $I_L$. On the contrary, when the voltage $V_{REG}$ is greater than the reference voltage $V_{REF,REG}$, the inductor current control circuit 310 decreases the duty cycle of the control signal $V_{GP}$ and increases the duty cycle of the control signal $V_{GN}$ to decrease the inductor current $I_L$.

Figure 4:
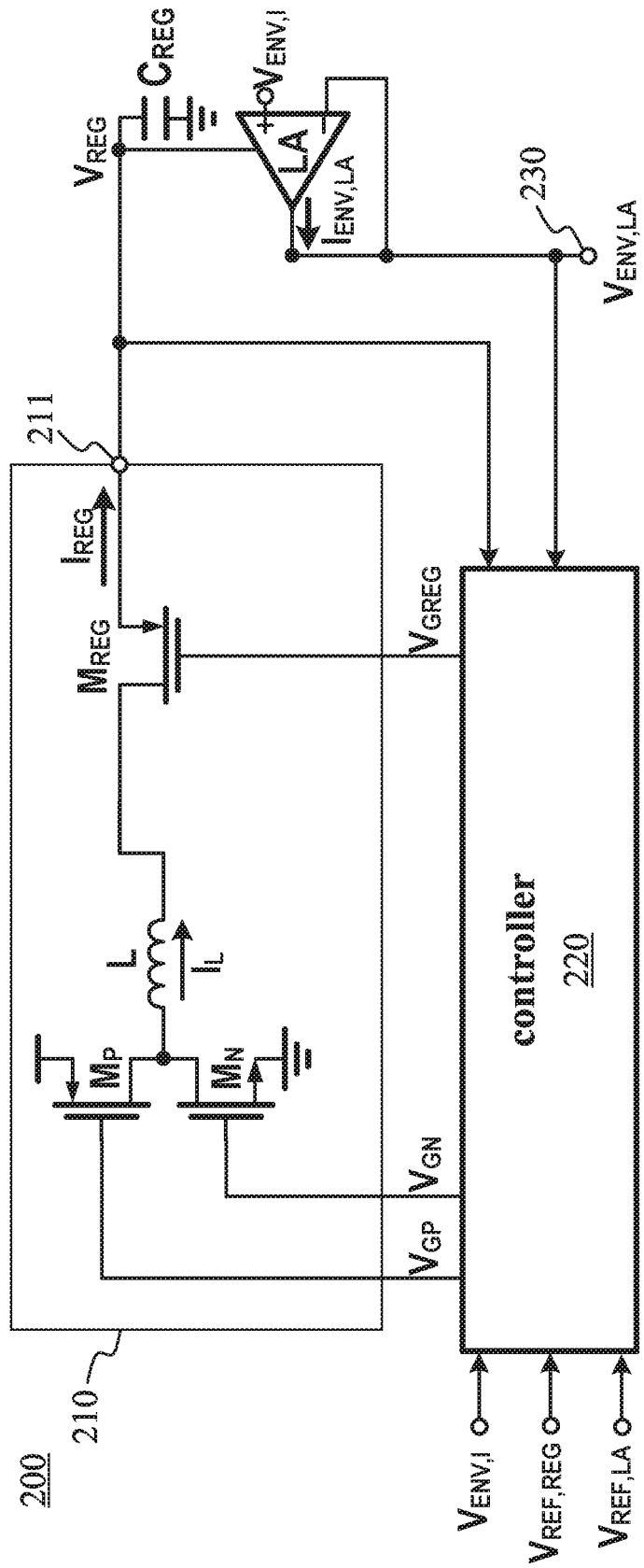
FIG. 4 illustrates a circuit diagram of FIG. 2 when the transistor $M_{REG}$ is turned on and the transistor $M_{AVG}$ is turned off.
Figure 5:
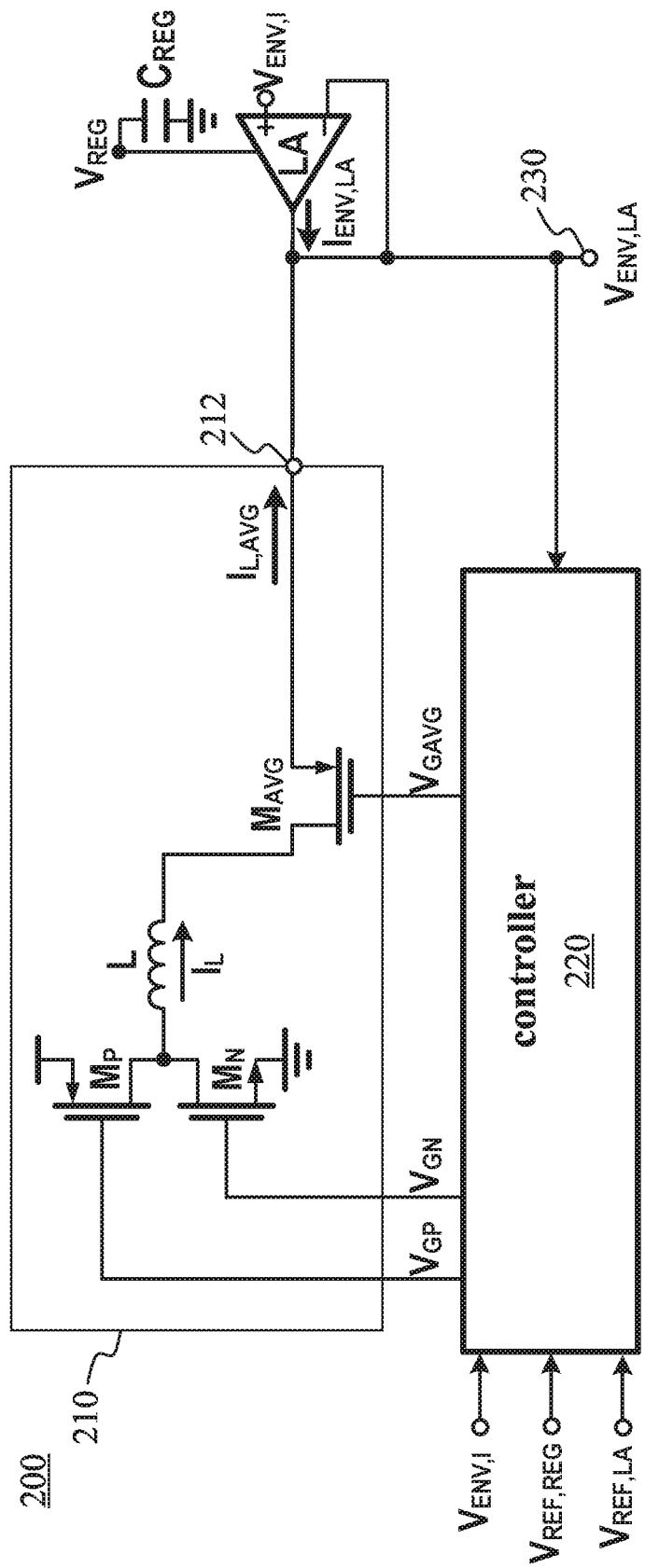

The energy stored in the inductor L is outputted via the output terminal 211 or the output terminal 212 under the control of the control signals $V_{GAVG}$ and $V_{GREG}$. The control signals $V_{GAVG}$ and $V_{GREG}$ are generated by the current proportion control circuit 320 according to the baseband envelope signal $V_{ENV,I}$, the output voltage $V_{ENV,LA}$ of the ETSM 200, the reference voltage $V_{REF,LA}$, and the inductor current $I_L$. When the baseband envelope signal $V_{ENV,I}$ is smaller than the target voltage $V_{PED}$, the comparator 326 outputs the voltage $V_{GREG}$ at a first level to turn on the transistor $M_{REG}$, and outputs the voltage $V_{GAVG}$ at a second level, which is different from the first level, to turn off the transistor $M_{AVG}$ (as shown in FIG. 4). When the baseband envelope signal $V_{ENV,I}$ is greater than the target voltage $V_{PED}$, the comparator 326 outputs the voltage $V_{GREG}$ at the second level to turn off the transistor $M_{REG}$, and outputs the voltage $V_{GAVG}$ at the first level to turn on the transistor $M_{AVG}$ (as shown in FIG. 5).

In the case of FIG. 4, the current $I_{REG}$, which is equal to the inductor current $I_L$, provides a stable charging current for the capacitor $C_{REG}$ to maintain the voltage $V_{REG}$ at one terminal of the capacitor at an ideal value. In this instance, the output current of the ETSM 200 is exclusively provided by the output current $I_{ENV,LA}$ of the linear amplifier LA. In the case of FIG. 5 where the SIMO switch-mode converter 210 is connected in parallel with the linear amplifier LA, the output current of the ETSM 200 is simultaneously supplied by the output current $I_{ENV,LA}$ of the linear amplifier LA and the current $I_{L,AVG}$, which is equal to the inductor current $I_L$, and the energy required by the linear amplifier LA comes from the energy stored in the capacitor $C_{REG}$. Reference is made back to FIG. 3. The target voltage $V_{PED}$ is not a constant value but is associated with the output voltage $V_{ENV,LA}$ of the ETSM 200, the reference voltage $V_{REF,LA}$, and the inductor current $I_L$. The current detector 340 detects the inductor current $I_L$, and the peak detector 330 detects the peak value of the output voltage of the current detector 340 and generates a voltage $V_{LPD}$ accordingly. The current detector 340 detects the inductor current $I_L$ according to the voltage across the transistor M, which represents one of the transistors $M_P$, $M_N$, $M_{REG}$ and $M_{AVG}$ in FIG. 2. The current detector 340 converts the current value of the inductor current $I_L$ into a voltage value using the technique of current mirror and the technique of voltage follower. These techniques are well known to those skilled in the art and thus omitted for brevity. The transconductance amplifier 321 calculates a difference between the voltage $V_{LPD}$ and the output voltage $V_{ENV,LA}$ of the ETSM 200, and then the error amplifier 322 compares the difference with the reference voltage $V_{REF,LA}$ to obtain a target voltage $V_{PED}$. The function of the capacitor $C_{PED}$ is to hold the target voltage $V_{PED}$. The purpose of the current proportion control circuit 320 is to lock the difference between the output voltage $V_{ENV,LA}$ of the ETSM 200 and the voltage $V_{LPD}$, which is proportional to the inductor current $I_L$, at the reference voltages $V_{REF,LA}$, such that the ETSM 200 keeps a proportion of the energy outputted from the linear amplifier LA to the energy outputted from the inductor L at the output terminal 212 substantially stable when the change in the baseband envelope signal $V_{ENV,I}$ is relatively small. In other embodiments, the peak detector 330 and the current detector 340 may also be implemented outside the controller 220.

The switch 323 is controlled by a pulse signal issued by the edge detector 324. When the change in the baseband envelope signal $V_{ENV,I}$ is relatively small (i.e., the average of the inductor current $I_L$ is relatively stable, or the voltage $V_{REG}$ does not have a relatively large instantaneous change), the switch 323 remains turned on so that the target voltage $V_{PED}$ can respond to the change in the voltage $V_{LPD}$ (equivalent to responding to the change in the inductor current $I_L$) and the change in the output voltage $V_{ENV,LA}$ of the ETSM 200. When the baseband envelope signal $V_{ENV,I}$ has a relatively large increase, the inductor current control circuit 310 increases the inductor current $I_L$ according to the decreased voltage $V_{REG}$, and the current proportion control circuit 320 controls the inductor current $I_L$ to be outputted from the output terminal 212. With these two operations conducted simultaneously, the output voltage $V_{ENV,LA}$ of the ETSM 200 can quickly respond to the change in the baseband envelope signal $V_{ENV,I}$. However, in order to enhance the above-mentioned effect (i.e., to enhance cross regulation), when the hysteresis comparator 325 detects that the error signal $V_{PID}$ is greater than a high threshold or less than a low threshold (i.e., when a difference between the voltage $V_{REG}$ and the reference voltage $V_{REF,REG}$ is greater than a predetermined value; for example, a sudden increase in the peak of the baseband envelope signal $V_{ENV,I}$ causing the voltage $V_{REG}$ to drop), the edge detector 324 issues a pulse signal to cause the switch 323 to be temporarily turned off. When the switch 323 is turned off, the target voltage $V_{PED}$ is kept constant temporarily, so that the comparator 326 causes the control signal $V_{GAVG}$ to be maintained at the first level for a longer period of time (i.e., the turn-on time of the transistor $M_{AVG}$ becomes longer) to thus enhance the cross-regulation effect of the SIMM switch-mode converter 210. This disclosure uses the cross-regulation effect of the SIMO switch-mode converter 210 to enable the output voltage $V_{ENV,LA}$ of the ETSM 200 to more smoothly and quickly track the changes in the baseband packet signal $V_{ENV,I}$.

A steady-state value of the target voltage $V_{PED}$ is associated with the reference voltage $V_{REF,REG}$, the voltage $V_{LPD}$, and the reference voltage $V_{REF,LA}$. Basically, the design of the reference voltage $V_{REF,REG}$ is not flexible because the reference voltage $V_{REF,REG}$ determines the working voltage of the linear amplifier LA. In addition, the value of the reference voltage $V_{REF,LA}$ is adjusted according to the value of the voltage $V_{LPD}$. As a result, how to correctly generate the target voltage $V_{PED}$ is highly related to the value of the voltage $V_{LPD}$. The transimpedance gain of the current detector 340 determines the steady-state direct current (DC) voltage value of the reference voltages $V_{REF,LA}$.

Figure 6:
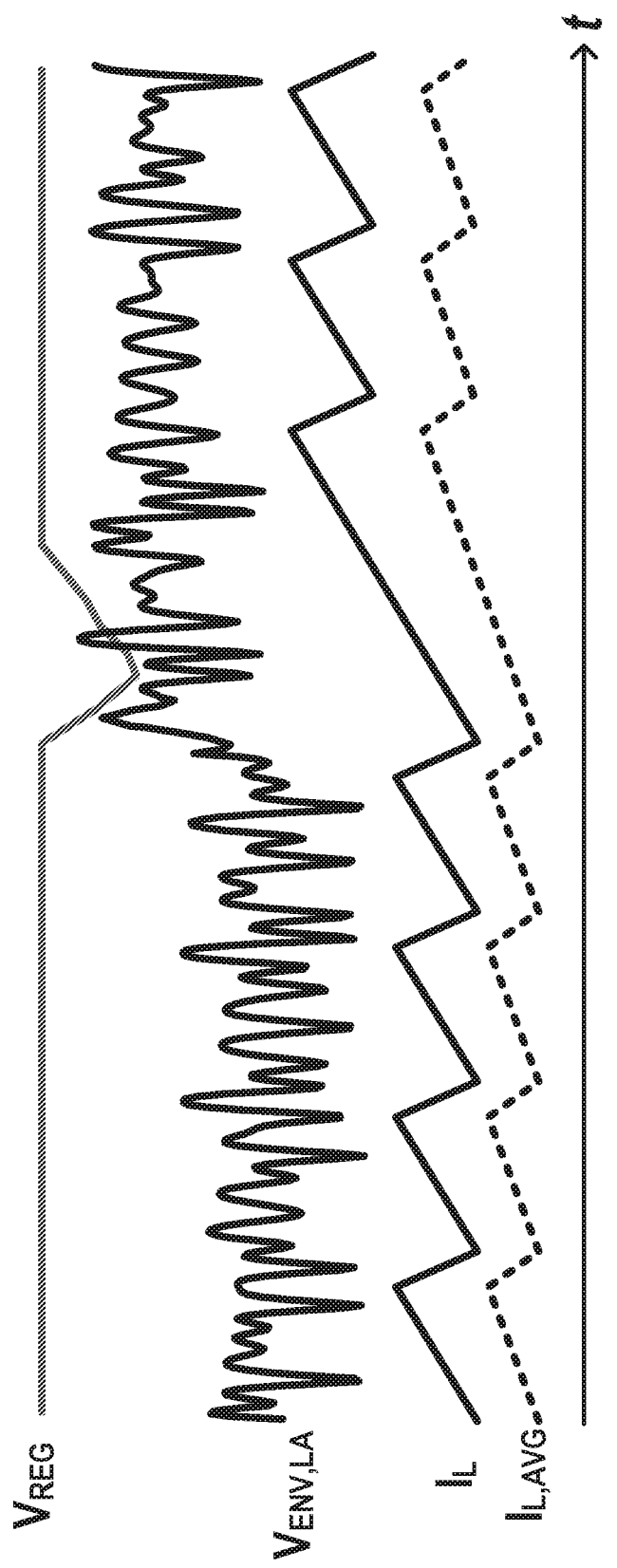
FIG. 6 illustrates a relationship between several voltage signals and several current signals in the ETSM 200.

FIG. 6 shows the relationship between several voltage signals and several current signals in the ETSM 200. As shown in the figure, when the voltage $V_{REG}$ has a relatively large decrease, the inductor current $I_L$ rises, which in turn causes the current $I_{L,AVG}$ to increase, thereby raising the output voltage $V_{ENV,LA}$ of the ETSM 200.

Since the energy of the linear amplifier LA is from the voltage $V_{REG}$, the controller 220 takes the feedback value of the voltage $V_{REG}$ as a main factor to manipulate the duty cycles of the control signals $V_{GP}$ and $V_{GN}$. The inductor current control circuit 310 of the controller 220 has a prioritized energy distribution control; more specifically, when the PID controller 312 is significantly changing the error signal $V_{PID}$, the target voltage $V_{PED}$ is temporarily kept constant (i.e., the switch 323 is temporarily turned off).

In summary, the ETSM 200 in this disclosure requires only one inductor to achieve power supply control for the linear amplifier LA and the RFPA; therefore, the circuit hardware costs can be reduced. In addition, by taking advantage of the cross-regulation characteristic of the SIMO switch-mode converter 210, this disclosure not only improves the reaction speed at which the voltage $V_{ENV,LA}$ at the output terminal 230 tracks the baseband envelope signal $V_{ENV,I}$, but also avoids energy waste. Furthermore, as the controller 220 of the ETSM 200 augments the cross-regulation effect, the overall circuit operates more smoothly. The ETSM 200 of this disclosure can be applied to a wireless communication system that utilizes amplitude modulation, such as a Long Term Evolution (LTE) wireless communication system based on quadrature amplitude modulation (QAM).

The shape, size, and ratio of any element and the step sequence of any flow chart in the disclosed figures are exemplary for understanding, not for limiting the scope of this disclosure. The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. An envelope-tracking power supply modulator (ETSM), supplying power to a radio frequency power amplifier (RFPA) of a radio frequency (RF) circuit according to a baseband envelope signal, comprising:
    a linear amplifier having an input terminal and an output terminal, wherein the input terminal receives the baseband envelope signal, and the output terminal is coupled to a power input of the RFPA;
    a capacitor having a first terminal and a second terminal, wherein the first terminal is coupled to a reference voltage, and the second terminal is coupled to a power input of the linear amplifier;
    a single-inductor multiple-output (SIMO) switch-mode converter having a first output terminal and a second output terminal, wherein the first output terminal is coupled to the capacitor and the power input of the linear amplifier, and the second output terminal is coupled to the output terminal of the linear amplifier and the power input of the RFPA; and
    a controller, coupled to the linear amplifier, the capacitor, and the SIMO switch-mode converter, controlling the SIMO switch-mode converter.

2. The ETSM of claim 1, wherein the SIMO switch-mode converter comprises an inductor, and the controller controls the current flowing through the inductor according to a voltage at the second terminal of the capacitor.

3. The ETSM of claim 1, wherein the SIMO switch-mode converter comprises an inductor, and the controller controls the current flowing through the inductor to flow to the first output terminal of the SIMO switch-mode converter or to the second output terminal of the SIMO switch-mode converter according to the baseband envelope signal.

4. The ETSM of claim 3, wherein the controller determines whether the current flowing through the inductor flows to the first output terminal or to the second output terminal by comparing the baseband envelope signal with a target voltage, and the controller determines whether to adjust the target voltage according to a voltage at the second terminal of the capacitor.

5. The ETSM of claim 4, wherein when the voltage at the second terminal of the capacitor is greater than a predetermined value, the controller decides not to adjust the target voltage.

6. The ETSM of claim 4, wherein the controller comprises:
    a current detector, coupled to the inductor, detecting a current flowing through the inductor and generating a voltage;
    wherein the target voltage is associated with the voltage and the voltage at the output terminal of the linear amplifier.

7. An envelope-tracking power supply modulator (ETSM), supplying power to a radio frequency power amplifier (RFPA) of a radio frequency (RF) circuit according to a baseband envelope signal, comprising:
    a linear amplifier having an input terminal and an output terminal, wherein the input terminal receives the baseband envelope signal, and the output terminal is coupled to a power input of the RFPA;
    an inductor;
    a capacitor having a first terminal and a second terminal, wherein the first terminal is coupled to a reference voltage, and the second terminal is coupled to a power input of the linear amplifier;
    a first switch, coupled to the inductor;
    a second switch, coupled to the inductor and the first switch;
    a third switch, coupled between the inductor and the second terminal of the capacitor;
    a fourth switch, coupled between the inductor and the output terminal of the linear amplifier;
    a current detector, coupled to the inductor, detecting the current flowing through the inductor; and
    a controller, coupled to the linear amplifier, the capacitor, the first switch, the second switch, the third switch, the fourth switch, and the current detector;
    wherein the controller controls the current flowing through the inductor by controlling the duty cycles of the first switch and the second switch.

8. The ETSM of claim 7, wherein the controller controls the duty cycles of the first switch and the second switch according to a voltage at the second terminal of the capacitor.

9. The ETSM of claim 7, wherein the current detector detects a current flowing through the inductor and generates a voltage accordingly, and the controller determines whether the third switch and the fourth switch are turned on according to the voltage and the baseband envelope signal.

10. The ETSM of claim 9, wherein the controller determines whether the third switch and the fourth switch are turned on by comparing the baseband envelope signal with a target voltage, in which the target voltage is associated with the voltage and the voltage at the output terminal of the linear amplifier.

11. The ETSM of claim 7, wherein the controller determines whether the third switch and the fourth switch are turned on by comparing the baseband envelope signal with a target voltage, and the controller determines whether to adjust the target voltage according to a voltage at the second terminal of the capacitor.

12. The ETSM of claim 11, wherein when the voltage at the second terminal of the capacitor is greater than a predetermined value, the controller decides not to adjust the target voltage temporarily.

* * * * *